United States Patent [19]
McShane et al.

[11] Patent Number: 5,147,821
[45] Date of Patent: Sep. 15, 1992

[54] METHOD FOR MAKING A THERMALLY ENHANCED SEMICONDUCTOR DEVICE BY HOLDING A LEADFRAME AGAINST A HEATSINK THROUGH VACUUM SUCTION IN A MOLDING OPERATION

[75] Inventors: Michael B. McShane; James J. Casto; Bennett A. Joiner, all of Austin, Tex.

[73] Assignee: Motorola, Inc., Schaumburg, Ill.

[21] Appl. No.: 786,205

[22] Filed: Oct. 31, 1991

Related U.S. Application Data

[62] Division of Ser. No. 589,465, Sep. 28, 1990, Pat. No. 5,105,259.

[51] Int. Cl.⁵ .................. H01L 21/56; H01L 21/58; H01L 21/60; H01L 21/603
[52] U.S. Cl. ........................... 437/212; 437/214; 437/902; 264/272.17
[58] Field of Search .......... 437/211, 212, 214, 902; 264/272.17; 249/97

[56] References Cited

U.S. PATENT DOCUMENTS

| | | | |
|---|---|---|---|
| 4,866,506 | 9/1989 | Nambu et al. | 357/72 |
| 4,944,908 | 7/1990 | Leveque et al. | 264/272.17 |

FOREIGN PATENT DOCUMENTS

| | | | |
|---|---|---|---|
| 58-143539 | 10/1983 | Japan | 437/211 |
| 1-241831 | 9/1989 | Japan | 437/211 |
| 2-58243 | 2/1990 | Japan | 437/902 |

Primary Examiner—Olik Chaudhuri
Assistant Examiner—David E. Graybill
Attorney, Agent, or Firm—Goddard, Patricia S.

[57] ABSTRACT

A method for making a semiconductor device having a heat sink is provided in which an opening through the heat sink enables a vacuum source to be applied to a semiconductor die mounting surface. In one form, a semiconductor die is attached to a mounting surface of a leadframe. The leadframe also has a plurality of leads which are electrically coupled to the semiconductor die. The semiconductor die and portions of the leads are encapsulated in a package body. Also incorporated into the package body is a heat sink. The heat sink has an opening which extends through the heat sink and exposes a portion of the mounting surface of the leadframe. The opening is used to apply a vacuum to the mounting surface during the formation of the package body so that the mounting surface and heat sink are held in close proximity. The closeness provides a good thermal conduction path from the semiconductor die to the ambient, thereby enhancing the thermal dissipation properties of the device.

17 Claims, 2 Drawing Sheets

METHOD FOR MAKING A THERMALLY ENHANCED SEMICONDUCTOR DEVICE BY HOLDING A LEADFRAME AGAINST A HEATSINK THROUGH VACUUM SUCTION IN A MOLDING OPERATION

CROSS-REFERENCE TO RELATED APPLICATION

This is a divisional of application Ser. No. 07/589,465, filed Sep. 28, 1990 now U.S. Pat. No. 5,105,259.

Related subject matter is disclosed in U.S. patent application Ser. No. 07/519,375, now U.S. Pat. No. 5,105,259, entitled "Semiconductor Device Having an Insertable Heat Sink and Method for Mounting the Same," filed May 3, 1990 and assigned to the assignee hereof.

TECHNICAL FIELD OF THE INVENTION

The present invention relates to semiconductor devices in general, and more specifically to thermally enhanced semiconductor devices and the encapsulation of such devices.

BACKGROUND OF THE INVENTION

An increase in the power consumption of semiconductor devices has led to a need for semiconductor packages which have a lower thermal resistance. In general, the plastics and ceramics commonly used to package semiconductor devices do not dissipate heat sufficiently for some types of devices. Examples of devices requiring good heat dissipation include fast static RAMs (random access memories), gate arrays, and microprocessors. One of the most common and effective approaches to greater thermal dissipation in semiconductor devices is the addition of a heat sink, or heat spreader, to the package. A heat sink is typically made of a material having a high thermal conductivity, such as copper, and ideally would be in good thermal contact to the semiconductor die, would have a surface which is exposed to the ambient, and would have a maximized surface area.

Heat sinks used in semiconductor devices have taken many forms. Heat sinks may have irregular topographies, such as channels or grooves, to increase the exposed surface area of the heat sink, thereby improving thermal dissipation. In addition, a number of materials have been used as heat sink materials, including copper, copper alloys, copper-tungsten alloys, aluminum, aluminum alloys, molybdenum, and composites of these materials. Other features of heat sinks which have been used in the past are features which improve the adhesion of the heat sink to a semiconductor package. In the case of plastic semiconductor packages, using a heat sink may result in poor adhesion between the plastic encapsulating material and the heat sink. To overcome this problem, semiconductor manufacturers have used heat sinks having features such as dimples, holes, or roughened surfaces to achieve better adhesion.

Apart from achieving sufficient adhesion between a heat sink and a package body material, other problems of incorporating a heat sink into a semiconductor device exist. In the assembly of plastic semiconductor device packages, it is possible to incorporate a heat sink during the semiconductor die bonding operation, during the molding of the package body, or a heat sink may be attached after the package body is formed. However, a variety of manufacturing difficulties exist with each of these techniques.

To include a heat sink during a die bonding operation, a semiconductor die may be attached directly onto a heat sink which is attached to a leadframe, rather than onto a flag or mounting surface which is already part of the leadframe. While it seems reasonable to mount a die directly onto a heat sink in order to achieve good thermal conduction from the die to the heat sink, the added weight of the heat sink on a leadframe can cause substantial damage to the leadframe due to handling. Moreover, some of the equipment used in subsequent assembly operations may need to be modified in order to accommodate the presence of the heat sink on the leadframe.

To incorporate a heat sink within a device during the molding of a package body, the heat sink may be placed directly in a mold tool cavity such that it is at least partially encapsulated during the formation of the package body. Encapsulating the heat sink while forming the package body can have the advantage of achieving a standard package outline. Furthermore, it does not require the addition of an assembly operation to a conventional assembly process flow. A disadvantage associated with this method is that during the injection of an encapsulation material into the cavity, the heat sink is often moved, causing it to be misaligned within the package. There is also a risk that the heat sink will become completely encapsulated, thereby leaving no exposed surface from which to dissipate heat. Another disadvantage is that it is difficult to achieve good thermal contact between the heat sink and the semiconductor die. Air or the encapsulation material may be trapped between the heat sink and the die, thus increasing the overall thermal resistance of the device.

Incorporating a heat sink after the package body is formed generally involves attaching a heat sink to the exterior of the package through the use of an adhesive material, such as a thermally conductive epoxy. However in doing so, the heat sink is positioned away from the die such that good thermal conduction away from a semiconductor die to the heat sink is obstructed by the package body material and any voids which might be present in the material. Along with the disadvantage of not having the heat sink in good thermal contact with the die, there is also a disadvantage of having a nonstandard package outline. Furthermore, an attached heat sink increases the overall size of a semiconductor device which is an undesirable feature to most end users of semiconductor devices. Therefore a need existed for an improved thermally enhanced semiconductor device which can be readily manufactured with minimal modifications to conventional assembly equipment and which maintains the outline of a standard package.

BRIEF SUMMARY OF THE INVENTION

There is provided, in accordance with the present invention, a semiconductor device having enhanced heat dissipation ability which achieves these and other advantages. In one form, a semiconductor die having a plurality of bonding pads thereon is attached to a mounting surface of a leadframe. Along with a mounting surface, the leadframe also has a plurality of leads which are electrically coupled to the bonding pads of the semiconductor die. The semiconductor die and proximal ends of the plurality of leads are encapsulated in a package body such that a first portion of the mounting surface of the leadframe is exposed. A heat sink, having an opening therein which extends through the heat sink, is positioned such that an outer surface of the heat sink is substantially exposed, and an inner surface of the heat sink is adjacent to the mounting surface of the leadframe. The opening through the heat sink exposes a second portion of the mounting surface and enables a vacuum to be applied to the mounting surface in order to have the mounting surface and heat sink in close proximity during encapsulation of the device.

DESCRIPTION OF A PREFERRED EMBODIMENT

Figure 1:
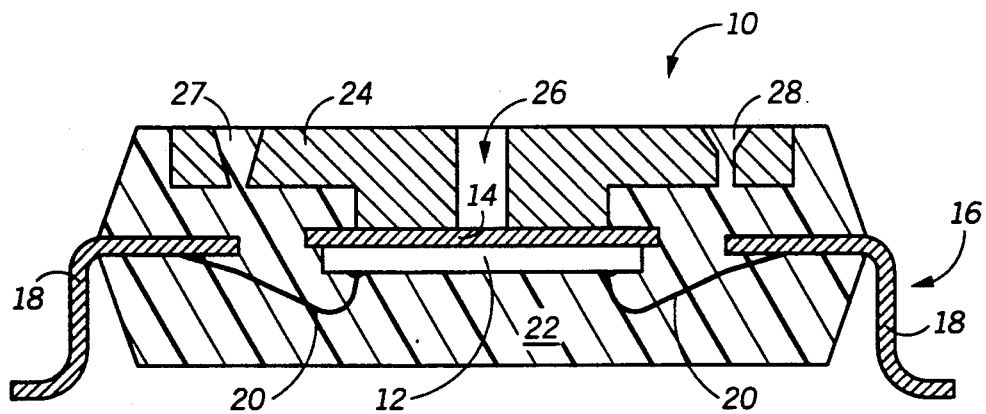
FIG. 1 is a cross-sectional view of a thermally enhanced semiconductor device, in accordance with the present invention.

With the present invention, it is possible to meet the previously stated desired features of a thermally enhanced device. The invention enables a heat sink within a semiconductor device to be in the thermal path of a semiconductor die and to have a maximized surface area which is exposed to the ambient. Moreover, the invention provides a method for manufacturing such a device. A semiconductor device 10, in accordance with the invention, is illustrated in FIG. 1. A semiconductor die 12 is attached to a mounting surface 14 of a leadframe 16 (not entirely shown), typically by use of a conductive adhesive material such as a conductive filled epoxy. Leadframe 16 is also made of a conductive material such as copper, a copper alloy, an iron-nickel alloy, or other metals. The leadframe may also be a TAB (tape automated bonding) tape which is commonly used in the art. Leadframe 16 has a plurality of leads 18 which each have ends proximal and distal to semiconductor die 12. The leads are electrically coupled to the die. As illustrated, wire bonds 20 are used to couple proximal ends of leads 18 to bonding pads (not shown) on semiconductor die 12. Wire bonds 20 are of a conductive material such as gold, copper, aluminum, or alloys of these materials. Other coupling methods, such as the use TAB bonds, may also be employed.

As illustrated in FIG. 1, the semiconductor die 12, the proximal ends of the leads, the wire bonds 20, and portions of the mounting surface 14 are encapsulated by a package body 22. Package body 22 is typically made of a molded plastic material, for example a phenolic epoxy, an epoxy novolac resin, or other molding compound resin. Distal ends of leads 18 extend out of package body 22 and are formed in a gull-wing configuration. The distal ends of the leads may also be formed into other lead configurations, such as a J-lead or a through-hole configuration. Semiconductor device 10 also has a heat sink 24 which may be of a conventional heat sink material, such as copper, a copper alloy, a copper-tungsten alloy, aluminum, an aluminum alloy, molybdenum, or a composite of these materials. Heat sink 24 has an outer and an inner surface. The inner surface of heat sink 24 is in contact with mounting surface 14, and therefore can effectively conduct heat away from semiconductor die 12. Although not shown in FIG. 1, a thermally conductive, adhesive material may be incorporated between the inner surface of heat sink 24 and mounting surface 14. The addition of an adhesive material will aid in keeping the heat sink and mounting surface in close proximity. In addition, use of an adhesive material will help prevent contaminants from entering into device 10 and causing harm to semiconductor die 12. Adhesive materials suitable for use with the present invention include materials commonly used to bond a semiconductor die to a mounting surface, such as a thermally conductive epoxy or solder. The outer surface of heat sink 24 is exposed to the ambient, thus providing a large surface area through which heat is removed from device 10. The outer surface of the heat sink 24 is flush with the outer surface of package body 22, allowing device 10 to have the advantage of a standard package outline. The heat sink may also include locking features, such as 27 and 28, which help secure heat sink 24 to package body 22 and help maintain good thermal contact between heat sink 24 and semiconductor die 12. As mentioned in the background section, such locking features are known in the art.

An opening 26 through the heat sink 24 illustrated in FIG. 1 is incorporated as a manufacturing aid, but also has other advantages. During the formation of package body 22, opening 26 is used to provide a vacuum to mounting surface 14. The reason for applying a vacuum is to assure that mounting surface 14 and heat sink 24 are held in close proximity during the encapsulation of semiconductor die 12. Having these two elements in close contact during the encapsulation process reduces the tendency for any of the encapsulation material to seep between the mounting surface 14 and the heat sink 24. Furthermore, having a vacuum applied to the mounting surface helps to hold the heat sink against the mold tool cavity, thereby preventing misalignment of the heat sink during the introduction of the encapsulating material. Having the heat sink held closely to the mold tool cavity also prevents the encapsulation material from seeping over the outer surface of the heat sink. An encapsulation process in accordance with the present invention will be described in more detail in the discussion of FIG. 3. The size of opening 26 may be optimized in order to achieve a desired pulling force on mounting surface 14; however, opening 26 is typically of such size that it is substantially visible.

Besides aiding in the manufacturing of a thermally enhanced semiconductor device, opening 26 also allows moisture to escape from the device. The addition of an opening in a semiconductor package for the purpose of releasing moisture is taught by Nambu et al. in U.S. Pat. No. 4,866,506, filed Jan. 29, 1987, and entitled "Plastic-Sealed IC Device of Heat Resistant Construction." A common problem in plastic semiconductor packages is that the plastic packages absorb and retain moisture. This problem is particularly harmful for surface mount packages. Due to the high temperatures and rapid temperature changes of the surface mount process (i.e. mounting the device to a substrate, such as a printed circuit board), the moisture in the package vaporizes, causing the package to crack. This is often referred to as "popcorn cracking." By having a hole in the heat sink, a vent is created from which the moisture may easily escape without damaging the package.

Figure 2:
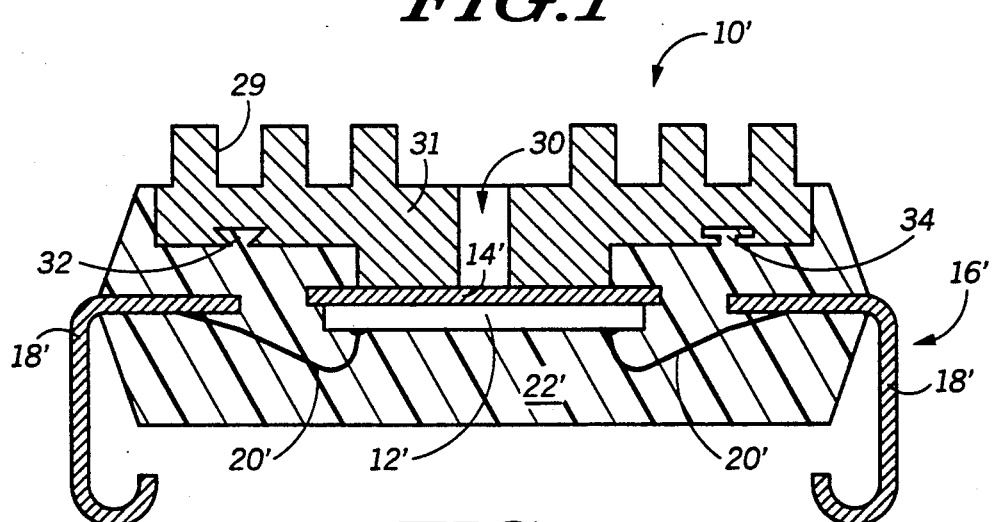
FIG. 2 is a cross-sectional view of a semiconductor device illustrating another embodiment of the present invention.

Illustrated in a cross-sectional view in FIG. 2 is an alternative embodiment of the invention. This embodiment is very similar to the previous embodiment with modifications to the heat sink shape, the shape of the locking features and the lead configuration. Device 10' is made up of a semiconductor die 12', a leadframe 16' (not entirely shown) having a mounting surface 14' and a plurality of leads 18', wire bonds 20' which electrically couple leads 18' to die 12', a package body 22', and a heat sink 31. Elements in this illustration are analogous to the corresponding elements of FIG. 1. The heat sink 31 in this embodiment has protrusions, such as protrusion 29. Protrusion 29 increases the exposed surface area of the heat sink, thereby increasing the amount of heat which is dissipated from device 10. The protrusions, including protrusion 29, are illustrated in cross-section as being square features, although any shape which increases the exposed surface area of the heat sink over the planar area is acceptable for use with the present invention. The manufacture of device 10' of FIG. 2 might require additional tooling modification to accomodate the presence of any protrusions. Heat sink 31 also has an opening 30 which extends through the heat sink, exposing the mounting surface 14' as in the previous form of the invention.

Another difference in the embodiment illustrated in FIG. 2 is the shape of the locking features, 32 and 34 respectively, used in the heat sink. These features are filled with the encapsulating material and hold the heat sink in place within the package body. Locking features are not necessary to the invention; however, the use of locking features helps to ensure that the heat sink remains in contact with the mounting surface and that the heat sink does not become removed from the package. As in the previous embodiment, a thermally conductive adhesive material may also be incorporated between the inner surface of heat sink 31 and mounting surface 14' to further ensure that the heat sink and mounting surface remain in close proximity. The configuration of leads 18' is also different from the previous embodiment. As illustrated in FIG. 2, leads 18' are formed into a J-lead configuration, rather than the gull-wing configuration of FIG. 1. While the J-lead and gull-wing configurations are conventionally used for surface mount packages, through-hole configurations may also be used in conjunction with the present invention.

Also in accordance with the present invention is a method for forming a thermally enhanced semiconductor device. During a conventional molding process of a plastic semiconductor package, a leadframe with a semiconductor die attached and electrically coupled thereto is placed on one of two mold tool platens. The two platens are then brought together to form a cavity around the die and proximal ends of the leads. An encapsulating material is introduced into the cavity, thereby forming a package body.

Figure 3:
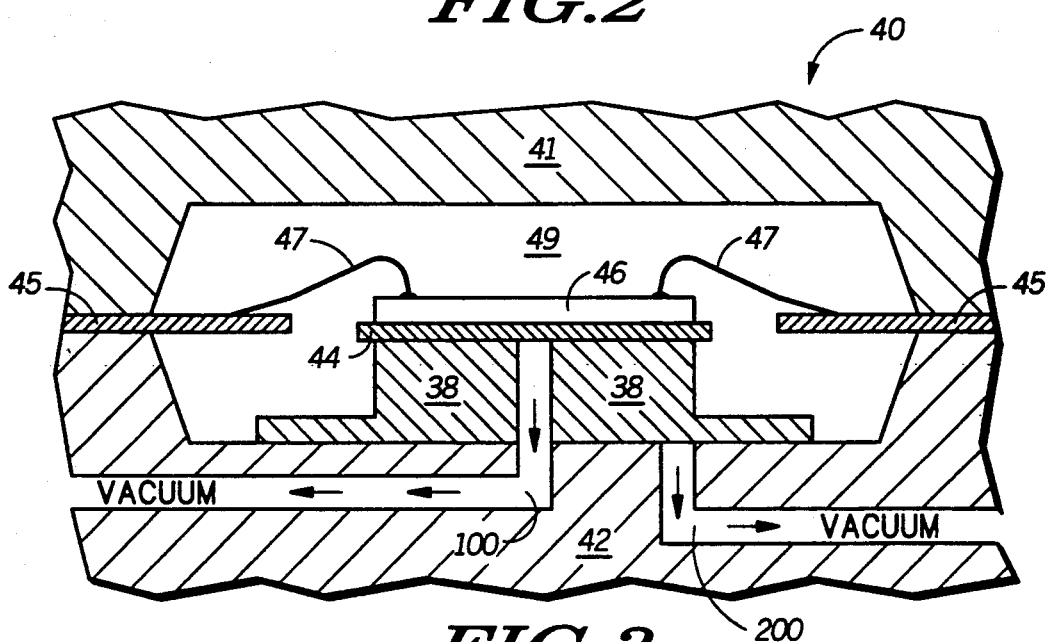
FIG. 3 is a cross-sectional view of a mold tool which illustrates a method of forming a semiconductor device, in accordance with the present invention.

With the present invention, a heat sink is also encapsulated during the formation of a package body. As illustrated in FIG. 3, a mold tool 40 has an upper and a lower platen, 41 and 42 respectively. A heat sink 38 is positioned in lower platen 42 of a mold tool 40. If desired, a thermally conductive adhesive material may be applied to the heat sink either before or after positioning the heat sink in the mold tool. The inclusion of such an adhesive material will aid in keeping the heat sink in close proximity to a semiconductor die mounting surface 44. Heat sink 38 has an opening which extends through the heat sink and is aligned to a first vacuum source, in this case vacuum line 100 within platen 42 (the vacuum source will be described in more detail at a later point). A leadframe (not entirely shown) is positioned and aligned on mold tool platen 42. The leadframe has mounting surface 44 and a plurality of leads 45. A semiconductor die 46 is attached to the mounting surface 44 and is electrically coupled to leads 45 by wire bonds 47. The leadframe is positioned such that mounting surface 44 covers vacuum line 100 and such that mounting surface 44 overlies heat sink 38. If using a thermally conductive adhesive material between the mounting surface and the heat sink, the adhesive material may be applied to the mounting surface, rather than to the heat sink. Platens 41 and 42 are brought together to form a cavity 49 around the semiconductor die 46, mounting surface 44, wire bonds 47, and proximal ends of leads 45. An encapsulating material (not shown) is then introduced into cavity 49, thus forming a package body about the semiconductor die. Any encapsulating material typically used in forming semiconductor packages, such as a novalc epoxy resin or other polymers, is suitable for use with the present invention.

In one form of the present invention, one of two mold tool platens is modified to include at least one vacuum source, unlike most conventional platens. While some mold tools on the market include a vacuum source, the vacuum in these tools is typically used to evacuate air from each of the mold tool cavities. By removing air from the cavities, there is a reduced probability that a void will be formed in the package body during the encapsulation process. Voiding is particularly a problem when the cavities are thin and when there is insufficient venting in the mold tool. Vacuum technology has also been used in one-sided molding in which a semiconductor die is molded directly onto a substrate, such as a printed circuit board. In the one-sided molding application, the vacuum is used to hold the substrate in place while an upper platen is placed over the substrate and a package is formed around the die. Vacuum technology has also been used to hold an over-molded substrate in place during encapsulation to control unwanted molding material, also known as flash, from covering certain portions of the substrate. For example, use of a vacuum to control flash on a printed circuit board (PCB) in an over-molded pin grid array (OMPGA) package is taught. in an article by M. McShane et al., entitled, "A Unique Low Cost Pin Grid Array Package with Heat-spreader," which was published in the *Proceedings of the Ninth Annual International Electronics Packaging Conference*, Sep. 11–13, 1989, pp. 199–207.

As illustrated in FIG. 3 in accordance with the present invention, two vacuum sources are included in platen 42. Vacuum line 100 is used to pull a vacuum (or partial vacuum) on mounting surface 44 of the leadframe (not shown entirely). The opening through heat sink 38 provides a path from vacuum line 100 to mounting surface 44. This vacuum is used to ensure that mounting surface 44 is held in close proximity to heat sink 38 to substantially prevent any encapsulating material from penetrating between these elements. The addition of a thermally conductive adhesive material on the inner portion of the heat sink further ensures that the heat sink and mounting surface are held in close proximity. By having mounting surface 44 and heat sink 38 in close proximity, the heat dissipation away from semiconductor die 46 is improved over devices which have encapsulating material separating the die and the heat sink. A second vacuum source, vacuum line 200, may be used to pull a vacuum (or partial vacuum) on heat sink 38. Although vacuum line 200 is not a necessary element of the invention, it is included in this embodiment as an additional manufacturing aid. Vacuum line 200 secures heat sink 38 to the mold platen 42 such that a significant portion of the encapsulating material cannot enter between the heat sink and platen. In doing so, what is to be the exposed portion of the heat sink is protected from being covered by the encapsulating material. Upon formation of the package body, the maximum surface area of the heat sink will be exposed to the ambient, thus establishing an optimal condition for thermal dissipation of the device. As mentioned above, using a vacuum to control flash in a thermally enhanced semiconductor device is known and can be used in conjunction with the present invention as a manufacturing aid. Securing the heat sink to the platen through the use of a vacuum also prevents misalignment of the heat sink during the introduction of the encapsulating material into the cavity.

The vacuum sources illustrated in FIG. 3 are tubular; however, the configuration of the vacuum source may be modified. For instance, the portion of the source which is next to either the heat sink or mounting surface may be enlarged in order to have a stronger pulling force on the element. Another method of increasing the pulling force is to configure the vacuum source in a ring shape which will increase the area of the heat sink or mounting surface under vacuum. Furthermore, the two sources illustrated in FIG. 3 might be combined into one vacuum source to reduce tooling modification costs and complexity.

Figure 4:
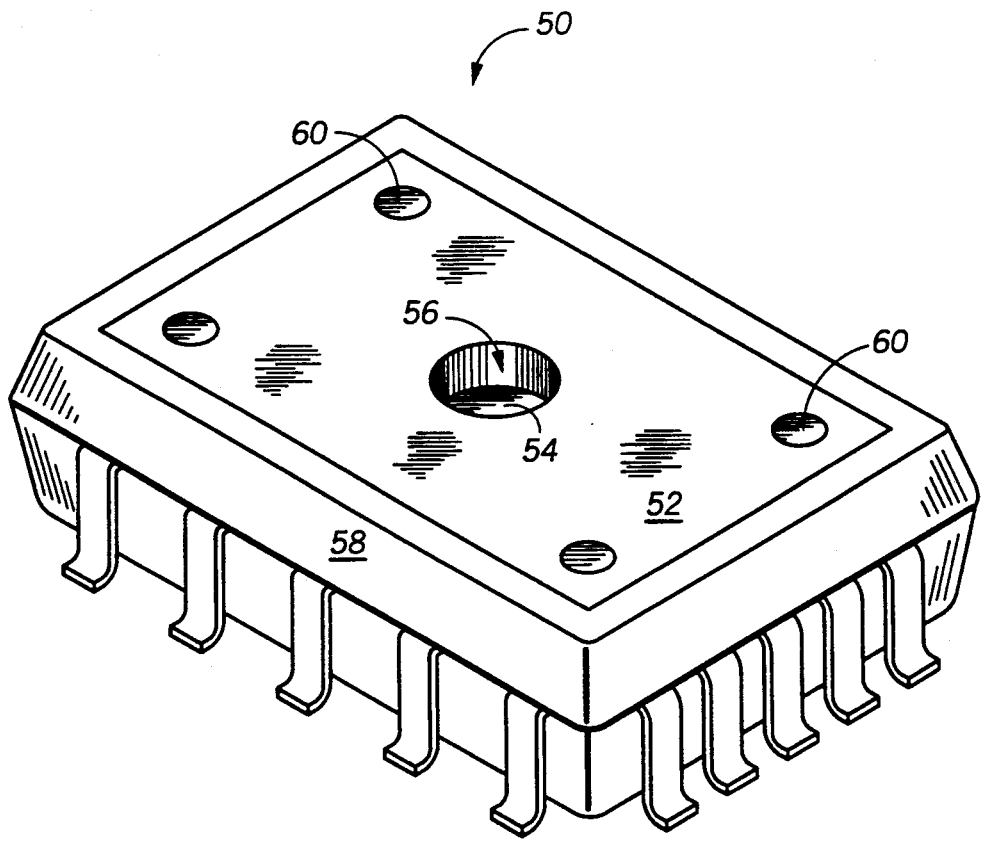
FIG. 4 is a perspective illustration of another form of a thermally enhanced semiconductor device, also in accordance with the present invention.

A perspective view of a semiconductor device in accordance with the invention is illustrated in FIG. 4. A semiconductor device 50 has a heat sink 52 which is used to dissipate heat from a semiconductor die (not shown). The semiconductor die is attached to a mounting surface 54 of a leadframe (not entirely shown). The mounting surface 54 is visible through an opening 56 which extends through heat sink 52. Opening 56 is provided in order to apply a vacuum to mounting surface 54 during the formation of a package body 58. By applying a vacuum to the mounting surface, mounting surface 54 and heat sink 56 are held closely together during the encapsulation of the semiconductor die. Upon forming package body 58, heat sink 52 and mounting surface 54 remain in close proximity, such that a good thermal path exists from the semiconductor die to the heat sink, and therefore to the ambient.

Also within the heat sink 52 illustrated in FIG. 4 are locking features 60. Unlike the locking features of previous embodiments, locking features 60 are located near each corner of heat sink 52. The number and position of locking features 60 which might be used with the present invention need not be as illustrated in FIG. 4. Rather, a sufficient number and location of locking features to ensure that heat sink 52 is held securely in the package body and in close proximity to mounting surface 54 is desirable. The shape of locking features 60 may also be modified to best meet the needs of a particular semiconductor device. The locking features 60 of device 50 extend through heat sink 52 such that the encapsulating material used to form package body 58 is visible. The locking features used need not extend entirely through the heat sink. For an example of such locking features, refer to FIG. 2. For the device of FIG. 2, the encapsulating material would not be visible at the outer surface of the heat sink because the locking features do not extend through the exposed surface of the heat sink. While the use of locking features in conjunction with the present invention has been discussed in great detail, it is important to note that the use of locking features may not be necessary. A heat sink surface may adhere to a package body sufficiently by use of other adhesion promoters such that locking features are not needed.

Heat sink 52 is illustrated as having a rectangular shape in FIG. 4. Package body 58 is also rectangular, such as the package bodies of PLCCs (plastic leaded chip carriers) or QFPs (quad flat packs). By incorporating a rectangular heat sink in a rectangular package body, a maximized exposed heat sink surface area can be achieved. However, as mentioned earlier, the shape of the heat sink may be modified to meet other device or manufacturing requirements. Other possible heat sink shapes include rectangular, square, circular, oval, or an irregular geometric shape.

Figure 5:
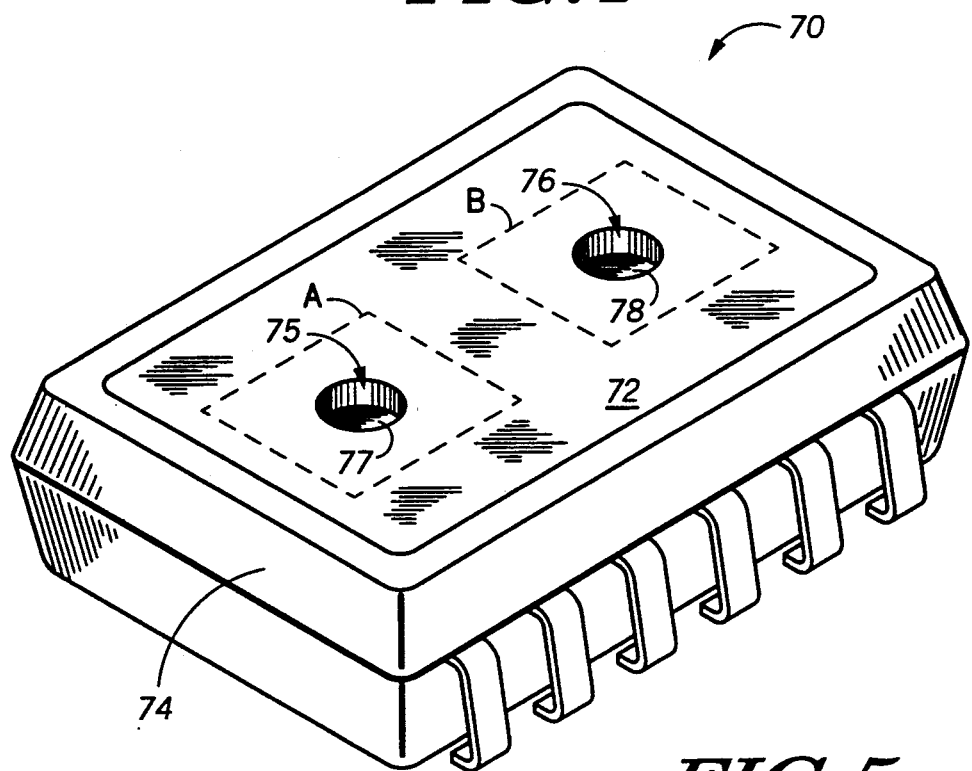
FIG. 5 is a perspective illustration of another embodiment of the present invention.

Illustrated in FIG. 5 is another perspective view of a semiconductor device 70 which is also in accordance with the present invention. In this embodiment, the device has two semiconductor die (not shown) which are attached to two mounting surfaces, 77 and 78. Only a portion of the mounting surfaces are visible, but the remaining portions of the mounting surfaces are represented in the figure by dotted lines A and B. Because device 70 has two mounting surfaces, a heat sink 72 has two openings 75 and 76 which extend through heat sink 72. Openings 75 and 76 are provided in order to apply a vacuum to mounting surfaces 77 and 78, repectively, during the formation of a package body 74. Similarly, two separate heat sinks might be used in device 70, as opposed to one heat sink having two openings as illustrated. Furthermore, a semiconductor device may have any number of semiconductor die, any number of mounting surfaces, and any number of heat sinks and be in accordance with the present invention.

The present invention provides a low cost, easy to manufacture semiconductor device having a heat sink. The inventive device meets optimal conditions of a thermally enhanced device, namely a heat sink which is in the direct thermal path of low thermal resistance with the semiconductor die and has a maximized surface area which is exposed to the ambient. In addition to these optimal conditions, the present invention also provides the opportunity to have a standard package outline for the device. The presence of an opening through a heat sink, in accordance with the present invention, permits a vacuum to be applied to a mounting surface of a leadframe in order to hold the mounting surface in close proximity to the heat sink during the formation of a package body. The close proximity between these elements is necessary in order to provide an optimal thermal path from a semiconductor die to the ambient. The presence of the opening has the additional advantage of allowing any moisture within the package to escape during board mounting, thereby preventing the package from cracking. The invention requires minimal tooling modification to conventional assembly equipment; therefore, the cost of assembling the device is kept low. Only one tooling modification is essential, that being the addition of at least one vacuum source to the mold tool which is used to hold the mounting surface and heat sink in close proximity during the formation of the package body. An additional benefit achieved by using a vacuum source in a mold tool is that the vacuum may also be used to remove air from the mold cavity prior to introducing an encapsulating material. Furthermore, after the package body has been formed, air can be forced through a vacuum line to assist in ejecting a device from the cavity.

Thus it is apparent that there has been provided, in accordance with the invention, a thermally enhanced semiconductor device and method for forming the same that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, use of the invention is not limited to use in conjunction with semiconductor devices having only one semiconductor die but may be used with multiple die devices. The invention is not limited to using the materials mentioned for the various elements of the invention, but may include use of any material which meets the needs of that particular element. Nor is the invention limited to using the heat sink configuration illustrated or described. Any heat sink having an opening through which a vacuum is applied may be used and is considered to be within the scope of the invention. Furthermore, it is not intended that the invention be limited to the use of only one heat sink. Therefore, it is intended that this invention encompass all such variations and modifications as fall within the scope of the appended claims.

We claim:

1. A method for making an encapsulated thermally enhanced semiconductor device, comprising the steps of:
   providing a mold tool having a first and second platen and at least one opening for receiving a vacuum in the first platen;
   providing a leadframe having a semiconductor die attached to a mounting surface of the leadframe and having a plurality of leads which are electrically coupled to the semiconductor die;
   providing a heat sink having perimeter and an opening therein which extends through the heat sink and which is displaced from the perimeter of the heat sink;
   positioning the heat sink within the first platen such that the opening through the heat sink is aligned with at least one opening in the first platen;
   positioning the leadframe with the semiconductor die attached and electrically coupled thereto on the first platen such that the mounting surface of the leadframe is adjacent to the heat sink within the first platen and such that the mounting surface covers the opening in the heat sink and the at least one opening in the first platen which is aligned to the opening in the heat sink;
   bringing the first and second platens together to form a cavity around the semiconductor die;
   applying a vacuum through the at least one opening in the first platen and through the opening in the heat sink in order to pull the mounting surface in close proximity to the heat sink; and
   introducing an encapsulating material into the cavity which conforms to the heat sink and encapsulates the semiconductor die.

2. The method of claim 1 wherein the step of providing a mold tool further comprises providing a mold tool having a first and second platen, the first platen having two openings for receiving a vacuum.

3. The method of claim 1 further comprising the step of applying a thermally conductive adhesive material to a surface of the heat sink which is adjacent the mounting surface of the leadframe.

4. The method of claim 1 further comprising the step of applying a thermally conductive adhesive material to a surface of the mounting surface of the leadframe which is adjacent the heat sink.

5. The method of claim 1 wherein the step of providing a heat sink further comprises providing a heat sink comprising a material selected from the group consisting of copper, copper alloys, copper-tungsten alloys, molybdenum, aluminum, aluminum alloys, and composites of these materials.

6. The method of claim 1 wherein the step of providing a heat sink further comprises providing a heat sink having a perimeter and an opening of such size that the opening is visible to the naked eye.

7. The method of claim 1 wherein the step of introducing an encapsulating material comprises introducing an encapsulating material into the cavity such that the opening in the heat sink is not filled by the encapsulating material.

8. A method for making an encapsulated thermally enhanced semiconductor device, comprising the steps of:
   providing a leadframe having a semiconductor die attached to a mounting surface of the leadframe;
   providing a heat sink having an opening therein which extends through the heat sink;
   positioning the leadframe with the semiconductor die attached thereto adjacent the heat sink such that the mounting surface of the leadframe covers the opening in the heat sink;
   applying a vacuum to the opening in the heat sink to pull the mounting surface in close proximity to the heat sink; and
   encapsulating the semiconductor die and portions of the leadframe to form a package body in which the heat sink is secured.

9. The method of claim 8 wherein the step of encapsulating the semiconductor die and portions of the leadframe comprises encapsulating the semiconductor die and portions of the leadframe with a molding material which conforms to the heat sink.

10. The method of claim 9 wherein the step of encapsulating the semiconductor die and portions of the leadframe comprises encapsulating the semiconductor die and portions of the leadframe with a molding material such that the opening in the heat sink is not filled with the molding material.

11. The method of claim 8 wherein the step of providing a heat sink comprises providing a heat sink having at least one locking feature to secure the heat sink in the package body.

12. The method of claim 8 further comprising the step of providing a thermally conductive adhesive material either on a surface of the heat sink which is adjacent the mounting surface of the leadframe or on a surface of the mounting surface which is adjacent the heat sink.

13. The method of claim 8 wherein the step of providing a heat sink comprises providing a heat sink having an opening of such size that the opening is visible to the naked eye.

14. A method for making an encapsulated thermally enhanced semiconductor device, comprising the steps of:

provInstruction a mold tool having an upper and a lower platen, the lower platen having an opening through which a vacuum is applied;

providing a leadframe having a semiconductor die attached to a mounting surface thereof;

providing a heat sink having an opening which extends completely through the heat sink;

placing the heat sink adjacent the lower platen such that the opening of the heat sink is aligned to the opening of the lower platen;

placing the leadframe with the semiconductor die attached thereto on the heat sink such that the mounting surface of the leadframe overlies the opening of the heat sink;

applying the vacuum through the opening in the lower platen and the opening of the heat sink to bring the mounting surface of the leadframe in close proximity to the heat sink;

bringing the upper and lower platens of the mold tool together to form a cavity about the semiconductor die and portions of the leadframe; and introducing an encapsulating material into the cavity which conforms to the heat sink and encapsulates the semiconductor die.

15. The method of claim 14 wherein the step of introducing an encapsulating material comprises introducing an encapsulating material into the cavity which conforms to the heat sink and encapsulates the semiconductor die while leaving a surface of the heat sink unencapsulated.

16. The method of claim 14 further comprising the step of providing a thermally conductive adhesive material either on a surface of the heat sink which is adjacent the mounting surface of the leadframe or on a surface of the mounting surface which is adjacent the heat sink.

17. The method of claim 14 wherein the step of providing a heat sink further comprises providing a heat sink comprising a material selected from the group consisting of copper, copper alloys, copper-tungsten alloys, molybdenum, aluminum, aluminum alloys, and composites of these materials.

* * * * *